United States Patent
Zonte

(10) Patent No.: US 11,940,831 B2
(45) Date of Patent: Mar. 26, 2024

(54) CURRENT GENERATOR FOR MEMORY SENSING

(71) Applicant: Infineon Technologies LLC, San Jose, CA (US)

(72) Inventor: Cristinel Zonte, Colorado Springs, CO (US)

(73) Assignee: Infineon Technologies LLC, San Jose, CA (US)

( * ) Notice: Subject to any disclaimer, the term of this patent is extended or adjusted under 35 U.S.C. 154(b) by 135 days.

(21) Appl. No.: 17/653,409

(22) Filed: Mar. 3, 2022

(65) Prior Publication Data

US 2023/0176604 A1 Jun. 8, 2023

Related U.S. Application Data

(60) Provisional application No. 63/286,875, filed on Dec. 7, 2021.

(51) Int. Cl.
*G11C 16/30* (2006.01)
*G05F 3/26* (2006.01)
(Continued)

(52) U.S. Cl.
CPC .......... *G05F 3/265* (2013.01); *G11C 16/0466* (2013.01); *G11C 16/26* (2013.01); *G11C 16/30* (2013.01)

(58) Field of Classification Search
CPC . G05F 3/265; G05F 3/267; G05F 3/30; G11C 16/0466; G11C 16/26; G11C 16/30;
(Continued)

(56) References Cited

U.S. PATENT DOCUMENTS 5,608,679 A * 3/1997 Mi ..................... G11C 16/3459
365/185.21
8,217,713 B1 7/2012 Raghavan et al.
(Continued)

FOREIGN PATENT DOCUMENTS

CN 110941304 B * 2/2022 ............... G01K 7/01
EP 1420412 A1 * 5/2004 ......... G11C 13/0004
(Continued)

OTHER PUBLICATIONS

Infineon Technologies, LLC, "Notification of Transmittal of the International Search Report and the Written Opinion of the International Searching Authority, or the Declaration", PCT/US2022/077548, dated Oct. 4, 2022, 13 pages.

*Primary Examiner* — Michael T Tran
(74) *Attorney, Agent, or Firm* — Slater Matsil, LLP

(57) ABSTRACT

In accordance with an embodiment, a circuit includes: a trimmable reference current generator having a temperature dependent current output node, the trimmable reference current generator including: a proportional to absolute temperature (PTAT) current generation circuit; a first programmable current scaling circuit coupled to the PTAT current generation circuit and including a first output coupled to the temperature dependent current output node; a constant current generation circuit; a second programmable current scaling circuit coupled to the constant current generation circuit and including a first output coupled to the temperature dependent current output node; and a reference interface circuit having an input coupled to the temperature dependent current output node and an output configured to be coupled to a reference current input of a memory sense amplifier.

23 Claims, 8 Drawing Sheets

(51) Int. Cl.
*G11C 16/04* (2006.01)
*G11C 16/26* (2006.01)

(58) Field of Classification Search
CPC ..... G11C 29/021; G11C 29/028; G11C 7/062; G11C 2207/063; G11C 5/147; G11C 7/04
USPC .......................................... 365/185.21, 226
See application file for complete search history.

(56) References Cited

U.S. PATENT DOCUMENTS

| | | | |
|---|---|---|---|
| 8,531,235 B1 | 9/2013 | Zonte | |
| 2004/0245975 A1* | 12/2004 | Tran | G05F 3/30 323/313 |
| 2008/0025111 A1* | 1/2008 | Choy | G11C 7/14 365/189.09 |
| 2009/0080281 A1* | 3/2009 | Hashiba | G11C 5/143 327/109 |
| 2009/0251950 A1* | 10/2009 | Klostermann | G11C 13/0004 365/158 |
| 2010/0001711 A1 | 1/2010 | Marinca | |
| 2010/0103726 A1* | 4/2010 | Bae | G11C 11/5678 365/210.1 |
| 2011/0156027 A1* | 6/2011 | Yamazaki | H01L 29/24 257/E27.084 |
| 2015/0270006 A1* | 9/2015 | Yoo | G11C 7/04 365/185.21 |
| 2015/0279473 A1* | 10/2015 | Yoo | G11C 16/28 365/185.18 |
| 2016/0099049 A1* | 4/2016 | Lee | G11C 13/0064 365/148 |
| 2016/0293252 A1* | 10/2016 | Ogiwara | G11C 13/0069 |
| 2016/0306376 A1 | 10/2016 | Nee et al. | |
| 2016/0379708 A1* | 12/2016 | Katayama | G11C 11/1655 365/148 |
| 2017/0184658 A1* | 6/2017 | Uemura | H01L 25/0655 |
| 2017/0194055 A1* | 7/2017 | Qian | G11C 7/067 |
| 2018/0122825 A1* | 5/2018 | Lupino | H01L 27/11898 |
| 2018/0174656 A1* | 6/2018 | Chih | G11C 16/32 |
| 2018/0293029 A1* | 10/2018 | Achtenberg | G11C 29/028 |
| 2019/0316973 A1 | 10/2019 | Ippolito et al. | |
| 2020/0058351 A1* | 2/2020 | Shin | G11C 13/004 |
| 2020/0111529 A1* | 4/2020 | Shin | G11C 16/28 |
| 2020/0183440 A1 | 6/2020 | Rasmus | |
| 2021/0091724 A1* | 3/2021 | Johnson | H03F 1/0233 |
| 2021/0134357 A1* | 5/2021 | Park | G11C 11/40626 |
| 2021/0319816 A1* | 10/2021 | Huang | G11C 7/1051 |
| 2022/0180913 A1* | 6/2022 | Alam | G11C 11/1659 |
| 2022/0321029 A1* | 10/2022 | Yano | H03K 17/145 |

FOREIGN PATENT DOCUMENTS

| | | | | |
|---|---|---|---|---|
| EP | 1562201 A2 | * | 8/2005 | ............ G11C 16/28 |
| EP | 1599776 B1 | | 10/2015 | |
| JP | 2009074973 A | * | 4/2009 | ............ G11C 5/143 |
| WO | WO-2017167096 A1 | * | 10/2017 | ............ G01R 19/00 |

* cited by examiner

US 11,940,831 B2

CURRENT GENERATOR FOR MEMORY SENSING

CROSS-REFERENCE TO RELATED APPLICATIONS

This application claims the benefit under 35 U.S.C. § 119(e) of U.S. Provisional Patent Application No. 63/286,875, filed on Dec. 7, 2021, which is incorporated herein by reference in its entirety for all purposes.

GOVERNMENT INTERESTS

The invention described herein was made with government support under subcontract 07070-SC-001 awarded by Microelectronic Research Development Co. (Micro-RDC) as part of the prime contract FA9453-19-C-0011 awarded by the Air Force Research Laboratory. The United States Government has certain rights in the invention.

TECHNICAL FIELD

The present invention relates generally to a current generator for memory sensing.

BACKGROUND

Non-volatile memories, such as electrically erasable programmable read only memory (EEPROM) and flash memory, is commonly found in many electronic systems. In principle, a non-volatile memory includes large arrays of programmable memory cells that maintain their programmed state in the absence of an applied power supply voltage, and is therefore suitable for applications that require long-term, reliable data storage.

Non-volatile memory cells can be implemented in a variety of different forms using a variety of different semiconductor technologies. One specific example of a non-volatile memory cell is the silicon-oxide-nitride-oxide-silicon (SONOS) cell, in which a MOSFET transistor is formed with a gate that includes a nitride layer sandwiched between oxide layers. During programming, a high voltage is applied to a control gate, which causes electrons to tunnel through an oxide layer and become trapped in the nitride layer, thereby effectively changing the threshold of the MOSFET transistor. The content of the non-volatile memory cell is read by applying a voltage across the source/drain terminals of the MOSFET transistor and measuring the resulting current. When the non-volatile memory cell is in a programmed state, little or no current flows. On the other hand, when the non-volatile memory cell is an a non-programmed or "erase" state, a larger current flows. In typical applications, this current is measured using a sense amplifier that compares the current flowing through the non-volatile memory cell with a reference current. Thus, when the measured current is less than the reference current, a first logic state is attributed to the non-volatile memory cell; and if the measured current is greater than the reference current a second logic state is attributed to the non-volatile memory cell. In some applications, the non-programmed or erase state may be assigned a logical "o," and the programmed state may be assigned a logical "1;" however the opposite convention could also be used.

As is the case with many semiconductor circuits, the output current produced by the non-volatile memory cell during readback is highly sensitive to a number of factors including semiconductor process parameters, temperature, applied voltage, and the age of the memory cell. Thus, a particular reference current optimized for one particular temperature may provide inadequate noise margin, or simply may not work at certain temperatures. Moreover, as the non-volatile memory ages and/or the non-volatile memory undergoes many programming cycles, the output currents produced by the non-volatile memory may shift. Accordingly, a particular reference current that was suitable when the memory cell was first manufactured may not be suitable after the memory cell has been operated over the course of a few years.

The issues described above may be further exacerbated when the non-volatile memory is operated over a very wide temperature range. For example, a non-volatile memory that operates reliably in a commercial temperature range of between 0° C. and 70° C. may no longer function reliably when the operational temperature range is extended, thereby making it unsuitable for the extended temperature ranges required by industrial (−40° C. to 85° C.) and military (−55° C. to 125° C.) applications.

SUMMARY

In accordance with an embodiment, a circuit includes: a trimmable reference current generator having a temperature dependent current output node, the trimmable reference current generator including: a proportional to absolute temperature (PTAT) current generation circuit; a first programmable current scaling circuit coupled to the PTAT current generation circuit and including a first output coupled to the temperature dependent current output node; a constant current generation circuit; a second programmable current scaling circuit coupled to the constant current generation circuit and including a first output coupled to the temperature dependent current output node; and a reference interface circuit having an input coupled to the temperature dependent current output node and an output configured to be coupled to a reference current input of a memory sense amplifier.

In accordance with another embodiment, a method includes: measuring an output current of a programmable PTAT generator of a reference current generator at a first scale setting of a plurality of programmable scale settings at a first temperature to obtain a first current measurement; measuring the output current of the programmable PTAT generator at a second scale setting of the plurality of programmable scale settings at the first temperature to obtain a second current measurement; measuring the output current of the programmable PTAT generator at the first scale setting of the plurality of programmable scale settings at a second temperature to obtain a third current measurement; and measuring the output current of the programmable PTAT generator at the second scale setting of the plurality of programmable scale settings at the second temperature to obtain a fourth current measurement; determining a scale setting of the plurality of programmable scale settings that configures the programmable PTAT generator to generate an output current having a predetermined temperature coefficient based on the first current measurement, the second current measurement, the third current measurement and the fourth current measurement; setting the programmable PTAT generator to the determined scale setting to provide a trimmed temperature dependent current; determining a constant current offset that provides a predetermined dc offset current at a third temperature when subtracted from the trimmed temperature dependent current; setting a programmable constant current generator of the reference current generator to provide the determined constant current offset;

generating, by the reference current generator, a reference current based on the trimmed temperature dependent current and the determined constant current offset; and comparing an output current of a memory cell of a memory circuit with the reference current.

In accordance with a further embodiment, a system includes: a memory array including a plurality of memory cells; a plurality of sense amplifiers coupled to the plurality of memory cells, each of the plurality of sense amplifiers configured to compare a current flowing through respective memory cell of the plurality of memory cells with a reference current; a trimmable reference current generator configured to produce first current including a difference between a predetermined current proportional to temperature and a first predetermined constant current; and a reference interface circuit configured to receive the first current, scale the received first current to form a scaled second current, and sum the scaled second current with a second predetermined constant current to form the reference current.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In an embodiment, a trimmable reference current generator for a memory sense amplifier of a memory circuit includes a first programmable scaling circuit configured to produce a scaled proportional to absolute temperature (PTAT) current and a second programmable scaling circuit configured to produce a scaled constant current. The sum of the scaled PTAT current and scaled reference current form a trimmable reference current. The reference current generator also includes an additional scaling circuit that further modifies the temperature coefficient and dc current value of the trimmable reference current in order to produce a reference current for a sense amplifier used in a memory system.

During trim and/or calibration, the first and second scaling circuits are adjusted such that the trimmable reference current has a predetermined temperature coefficient and a predetermined dc current value at a reference temperature (such as room temperature). By trimming the trimmable reference current to have a predetermined temperature coefficient and predetermined dc current, a highly accurate sense amplifier reference current can be formed that is advantageously suitable for sensing the state of the memory cell over a very wide temperature range regardless of process variations. In some embodiments, the sense amplifier reference current may be advantageously configured to provide sufficient sensing margin as the memory cell degrades over time and operation.

Figure 1A:
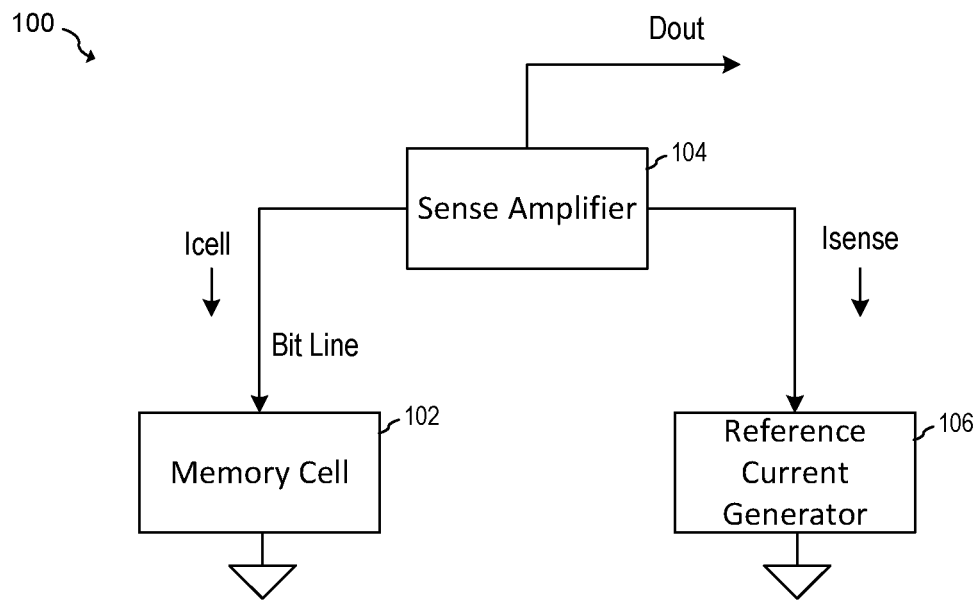
FIG. 1A illustrates a memory sensing system according to an embodiment.

FIG. 1A illustrates an embodiment memory sensing system 100 that includes memory cell 102, sense amplifier 104 and reference current generator 106. Memory cell 102 may be a non-volatile memory cell, such as a floating gate memory cell, that is configured to produce an output current Icell that depends on a memory state of the memory cell. For example, when memory cell 102 is in a programmed state, a lower bit line current Icell is produced. On the other hand, when memory cell 102 is in a non-programmed or an erase state, a higher bit line current Icell is produced. Accordingly, sense amplifier 104 can be used to determine the state of memory cell 102 by comparing the output current Icell of memory cell 102 provided to a sense input of sense amplifier 104 with a reference current Isense generated by current generator 106 provided to a reference current input of sense amplifier 104.

In various embodiments, memory sensing system 100 may be disposed on a single monolithic semiconductor integrated circuit, such as a single semiconductor substrate, and/or on the same monolithic semiconductor integrated circuit as other disclosed system components.

In the depicted embodiments, sense amplifier 104 produces a first logical state with respect to output signal Dout when output current Icell of memory 102 is less than reference current Isense, and produces a second logical state when output current Icell is greater than reference current Isense. The first and second logical states could be respectively referred to as a "low" state and a "high" state, or a "0" state and a "1" state. In some embodiments, this designation could be reversed such that the first and second logical states are respectively referred to as a "high" state and a "low" state, or a "1" state and a "0" state.

Memory cell 102 and sense amplifier 104 may be constructed using memory cell and sense amplifier circuits known in the art. For example, memory cell 102 could be a SONOS memory cell or a floating gate memory cell, and sense amplifier 104 may be implemented using a cross-coupled CMOS latch circuit. In alternative embodiments, other memory cell and sense amplifier circuits could be used.

In embodiments of the present invention, reference current generator 106 maybe implemented using embodiment trimmable reference current generation circuits described below.

Figure 1B:
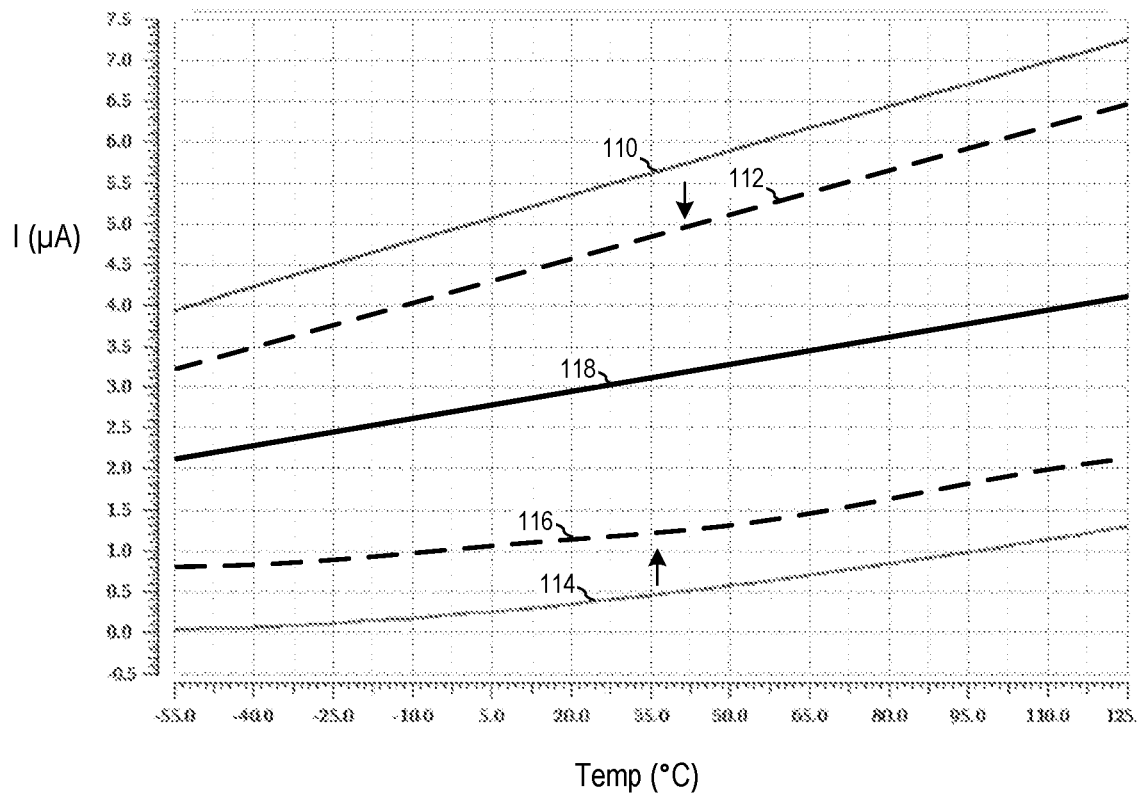
FIG. 1B illustrates a graph showing the relationship between memory cell output current and temperature.

FIG. 1B illustrates a graph showing the relationship between current and temperature for reference current Isense produced by reference current generator 106, and for output current Icell of memory cell 102 under different programming states and aging conditions. For example, traces 110 and 114 respectively represent the output current Icell for the programmed and non-programmed states of memory cell 102 for a newly fabricated device. It can be seen that each of these currents increase with increasing temperature. For example, programmed output current Icell represented by trace 110 increases from about 4 µA at −55° C. to about 7.2 µA at 125° C., and non-programmed output current Icell represented by trace 114 increases from about 0 µA at −55° C. to about 1.3 µA at 125° C. However, when memory cell 102 undergoes long periods of use, the output current of memory cell 102 shifts over time, such that the current Icell of memory cell 102 decreases in its programmed state, but increases in its non-programmed state. These shifts in output current are represented by trace 112 that represents the output current Icell of memory cell 102 for an aged device in the programmed state, and by trace 116 that represents the output current Icell of memory cell 102 for an aged device in the non-programmed state. In this example, the programmed current decreases by about 0.7 µA, and the non-programmed current increases by about 0.7 µA, which effectively decreases the sensing margin of the memory cell.

In order to be able to sense the state of memory cell 102 with sufficient margin, the temperature coefficient and dc offset of reference current Isense produced by reference current generator 106 is trimmed to provide sufficient sensing margin over a wide temperature range and various aging conditions. As shown in the example of FIG. 1B, reference current Isense, represented by trace 118 increases from about 2 µA at −55° C. to about 4 µA at 125° C. It should be understood that the graph of currents shown in FIG. 1B is an illustrative example that depicts one particular memory cell and reference current profile. Specific memory cell and reference current profiles may vary according to the particular system, semiconductor technology and memory cell circuit used.

Figure 2A:
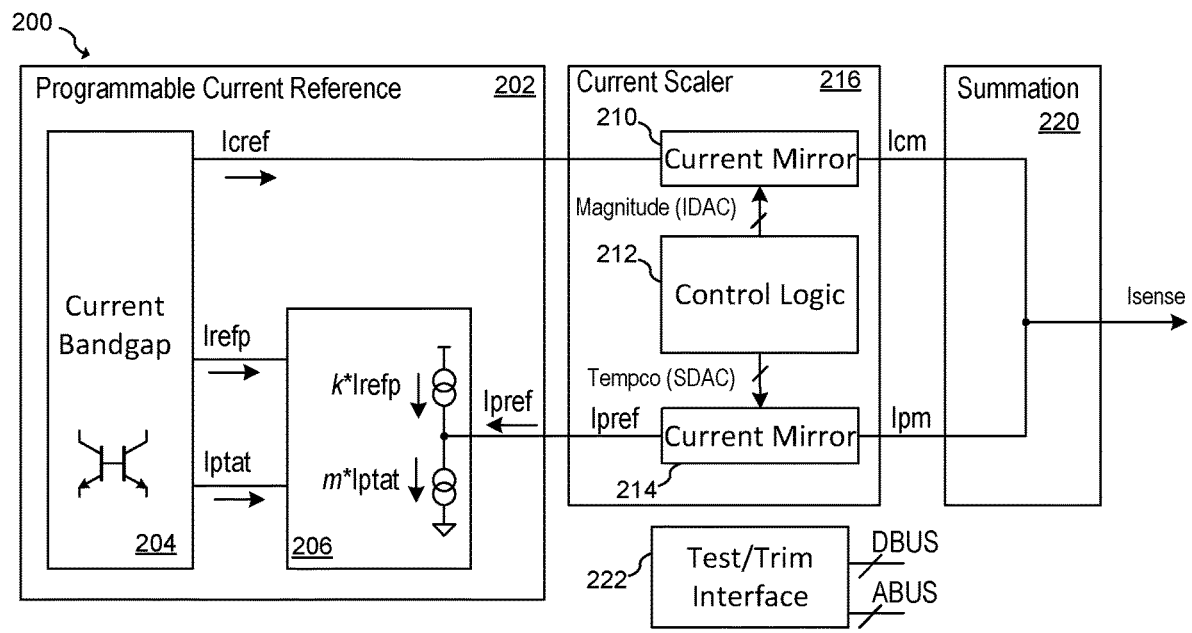
FIG. 2A illustrates a reference current generator according to an embodiment.

FIG. 2A illustrates reference current generator 200 according to an embodiment of the present invention that could be used to implement reference current generator 106 shown in FIG. 1A. As shown, reference current generator 200 includes a programmable current reference circuit 202, a current scaler 216, a summation circuit 220, and a test/trim interface 222. In embodiments of the present invention, programmable current reference circuit 202 is configured to provide a substantially temperature independent current Icref, and a scaled proportional to temperature current Ipref. Programmable current reference circuit 202 may be trimmed such that current Ipref has a predetermined temperature coefficient and dc offset, while current Icref may be trimmed to have a substantially temperature independent current of a predetermined devalue.

Current scaler 216 scales temperature independent current Icref to form current Icm, and scales proportional to temperature current Ipref to form Ipm. Currents Icm and Ipm are summed together via summation circuit 220 to form reference current Isense. Test/trim interface 222 is used to control the operation of current reference circuit 202 and current scaler 216; provide an interface between reference current generator 200 and a test circuit; and provide trim and calibration capability to reference current generator 200. In some embodiments, current scaler 216 and summation circuit 220 serves as a reference interface circuit between programmable current reference circuit 202 and a sense amplifier configured to receive reference current Isense.

In some embodiments, the trimmed values for Ipref and Icref produced by current reference circuit 202 may be the same predetermined target values for many categories of different products. For example, different classes of semiconductor IC products that contain different types of non-volatile memories may each include reference current generator 200 that is trimmed to produce the same target dc offset and temperature coefficient values for Ipref and Icref. This advantageously provides an accurate process independent current reference that can be used over a very wide temperature range.

While current reference circuit 202 maybe used to provide reference currents that are similar among many different products, current scaler 216 may scale Ipref and Icref using product specific scaling factors. These product specific scaling factors maybe determined, for example, by characterizing the memory cells of the specific product being produced. By separating the trimming of current reference circuit 202 from the product specific scaling factor provided by current scaler 216, the task of providing an accurate, process independent reference current can be decoupled from the challenge of implementing a product specific reference current. This is particularly helpful with respect to product testing, since the same testing and calibration routine targeting the same values can be reused over many products. In other words, the same verified test routine can be used over multiple products to ensure accurate reference currents over the multiple products.

Programmable current reference circuit 202 includes a current bandgap circuit 204, and a scaling circuit 206. Current bandgap circuit 204 may be implemented using a delta vbe circuit and/or a bandgap reference circuit to generate currents Icref and Irefp that are substantially constant over temperature and current Iptat that is proportional to absolute temperature (PTAT). Portions of current bandgap circuit 204 responsible for generating the currents Icref and Irefp maybe referred to as a constant current generation circuit, and portions of current bandgap circuit 204 responsible for generating PTAT current Ipat may be referred to as a PTAT current generation circuit. While a specific circuit implementation of current bandgap 204 will be discussed below with respect to FIG. 4B, it should be understood that current bandgap 204 may be implemented using a variety of current and voltage reference circuits known in the art. For example, PTAT current Iptat (also referred to as a temperature dependent reference current) may be generated using PTAT current generation circuits known in the art and constant current Irefp maybe generated using constant current generation circuits known in the art. It should also be understood that currents Icref and Irefp that are substantially constant over temperature may exhibit a small amount of temperature drift due to process variations and second order behavior in the current bandgap circuit 204. In some embodiments, currents Icref and Irefp may drift on the order of +/−1% over a temperature range of between −55° C. and 125° C. It should be appreciated that this temperature drift is a smaller than the temperature dependence of PTAT current Irefp.

Scaling circuit 206 applies a scaling factor (also referred to as a scale setting or a trim setting) of k to constant current Irefp to produce current k*Irefp, applies a scaling factor of m to PTAT current Iptat to produce current m*Iptat. Currents k*Irefp and m*Iptat are subtracted to form a scaled proportional to temperature current Ipref. In some embodiments, the scale settings k and m are applied using current digital-to-analog converters implemented using current mirrors with selectable outputs, as will be discussed below with respect to FIGS. 4A-4D. In some embodiments, current m*Iptat is greater than current k*Irefp. During test and calibration, final values for scale settings k and m are determined by measuring current Ipref over different temperatures and over different applied scale settings, as will be discussed below with respect to the method of FIG. 5.

Current scaler 216 includes current mirrors 210 and 214, which effectively serve as programmable current scaling circuits, and control logic 212. Current mirror 210 is configured to scale temperature independent current Icref according to digital word IDAC, and current mirror 214 is configured to scale proportional to temperature current Ipref according to digital word SDAC. Control logic 212 is configured to provide digital control words IDAC and SDAC to respective current mirrors 210 and 214. In various embodiments, control word SDAC is used to adjust the temperature coefficient of reference current Isense, and control word IDAC is used to control the dc value of reference current Isense. Current mirrors 210 and 214 may be implemented using current mirror circuits and switching circuits as described below with respect to FIGS. 4A-4D. Control logic 212 may be implemented for example, using digital register circuits known in the art. In alternative embodiments, the scale setting of current mirror 210 and/or current mirror 214 may be fixed and control logic 212 may be omitted.

The outputs of current scaler 216 are summed together by summation circuit 220. In the depicted embodiments, summation circuit 220 simply connects together outputs Icm and Ipm of current scaler 216 at a common node to provide a summed current that forms reference current Isense. In alternative embodiments, summation circuit 220 may include other circuitry such as current mirrors to form the sum of currents provided by current scaler 216.

Test/trim interface 222 may include a digital interface that is configured to read and write values in registers that are used to control the various scale settings in current reference 202 and current scaler 216; and may include non-volatile memory and/or programmable fuses to permanently store trim and configuration values. Test/trim interface 222 may also include an analog multiplexer configured to route voltages and currents generated within reference current generator 200 to a testing circuit, such as an external tester via analog signal bus ABUS. In some embodiments test/trim interface 222 may include digital interface circuitry configured to communicate with external components via a digital bus DBUS. The digital interface of test/trim interface 222 maybe a serial bus interface circuit, a parallel bus interface circuit, and/or may comply with any bus standard including, but not limited to SPI, CAN, I2C, LVDS, and USB. Accordingly, the number n of signal pins of digital bus DBUS may be any number appropriate to the implemented bus protocol.

Figure 2B:
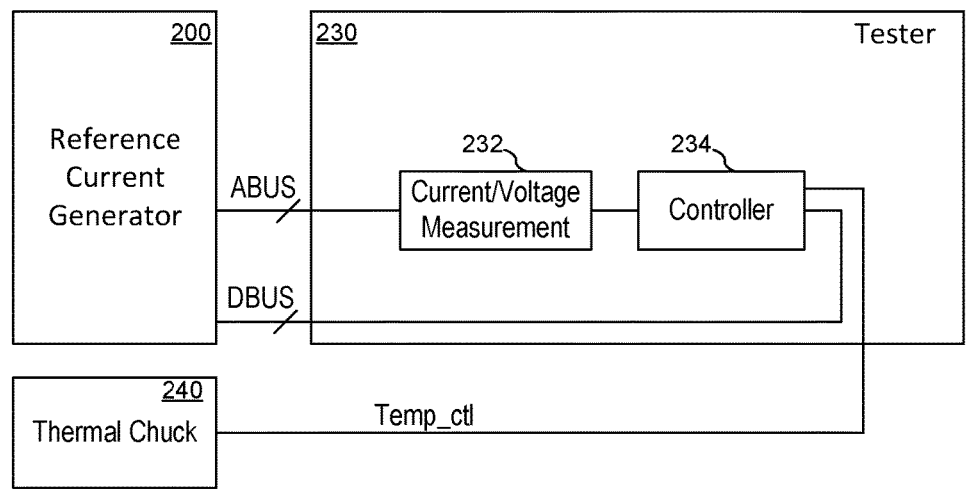
FIG. 2B illustrates a block diagram of a test environment according to an embodiment.

FIG. 2B illustrates a block diagram of a test environment that may be used to calibrate and trim reference current generator 200. As shown, reference current generator 200 is coupled to tester 230 via analog bus ABUS and digital bus DBUS. Tester 230 may be coupled to reference current generator 200 when reference current generator 200 is being calibrated or trimmed. For example, tester 230 may be coupled to reference current generator 200 during wafer testing, package testing, manufacturing testing or during routine maintenance or calibration operations. Tester 230 may be implemented, for example, using a wafer test fixture, packaging test fixture, semiconductor automated test equipment (ATE), or any other system that is configured to be coupled to reference current generator 200 for the purpose of testing. In some embodiments, the functionality of tester 230 may reside in the same integrated circuit as reference current generator 200.

As shown, tester 230 includes current and voltage measurement circuit 232 that is configured to measure currents and voltages generated by reference current generator 200. Such measurement circuitry may include, for example, voltage measurement circuits and current measurement circuits known in the art. In some embodiments, these voltage and current measurement circuits may include analog-to-digital converters configured to digitize the analog signals present on analog bus ABUS.

Controller 234 may be implemented using digital control circuitry known in the art, such as a microcontroller or a microprocessor that includes a software program stored on a non-transitory computer readable medium, such as memory or other storage media, that includes instructions to calibrate and trim reference current generator 200 according to methods described below with respect to FIG. 5. In alternative embodiments, controller 234 may be implemented using hardwired logic and/or programmable logic, such as a field programmable gate array (FPGA).

Controller 234 is configured to receive digitized current and voltage measurements from current and voltage measurement circuit 232, and is configured to issue commands to reference current generator 200 via digital bus DBUS. These commands may include, for example, commands to adjust the various current scale settings, commands to write trim values, and commands to route specific signals to tester 230 via analog bus ABUS.

In various embodiments, tester 230 measures analog signals generated by reference current generator 200 under different temperature conditions using thermal chuck 240 during wafer testing under the control of controller 234. During trim and calibration of reference current generator 200, controller 234 may issue temperature change commands to thermal chuck 240 via control signal Temp_ctl. Alternatively, the temperature of reference current generator 200 maybe changed using other types of equipment such as a temperature chamber or another systems or device configured to provide heating and refrigeration.

Figures 3A, 3B:
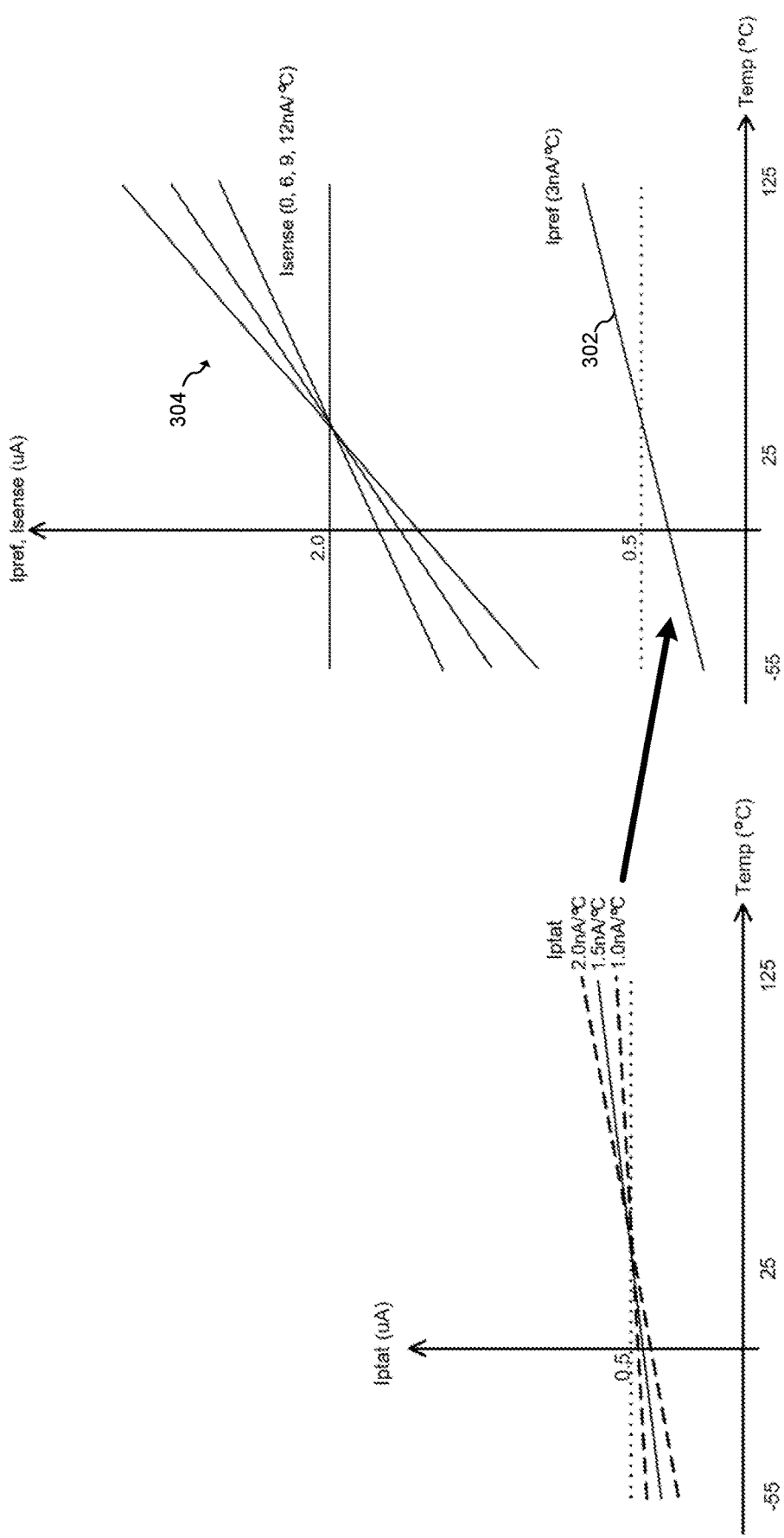
FIGS. 3A, 3B and 3C illustrate graphs of current with respect to temperature for various current signals within an embodiment reference current generator.
Figure 3C:
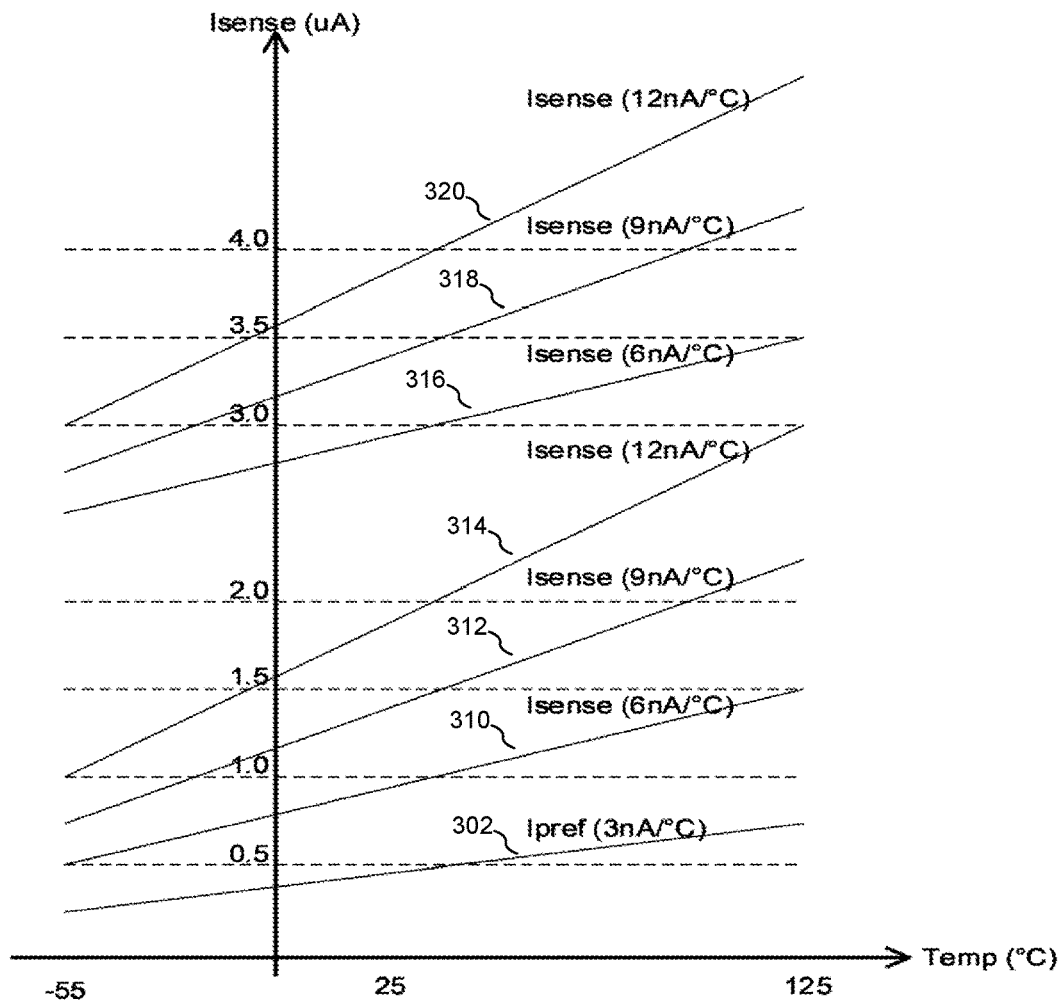

FIGS. 3A-C illustrate graphs of current with respect to temperature for various current signals within reference current generator 200. FIG. 3A illustrates a graph of PTAT current Iptat generated by current bandgap 204 over different process variations, in which Iptat is nominally designed to have a temperature coefficient value of 1.5 nA/° C. and a current offset of 0.5 µA at 27° C. It can be seen that the temperature coefficient of Iptat varies considerably over process from 1.0 nA/° C. to 2.0 nA/° C. in the illustrated example.

FIG. 3B illustrates a series of graphs of current with respect to temperature that show the relationship between proportional to temperature current Ipref generated by current reference circuit 202 and reference current Isense produced by reference current generator 200. In an embodiment of the present invention, current Iptat produced by current bandgap 202 is scaled by a factor m and constant current Irefp scaled by a factor k is subtracted in order to produce scaled proportional to temperature current Ipref, which is represented by trace 302 in FIG. 3B. In the depicted embodiment, Iptat and Irefp are scaled and subtracted to produce a current Ipref that has a temperature coefficient of 3.0 nA/° C. and a dc offset of 0.5 µA at 27° C. Current Ipref is further scaled by current mirror 214 of current scaler 216 and summed with a scaled version of constant current Icref to form reference current Isense, which is represented by traces 304. In the depicted embodiment, reference current Isense is shown having a dc offset of 2.0 µA at 27° C. and respective selectable temperature coefficients of 0.0 nA/° C., 3.0 nA/° C., 6.0 nA/° C., 9.0 nA/° C. and 12.0 nA/° C. depending on the specific scale factors applied by current mirrors 210 and 214 of current scaler 216.

FIG. 3C illustrates another example of possible relationships between proportional to temperature current Ipref that is trimmed to have a temperature coefficient of 3.0 nA/° C. and a dc offset of 0.5 µA at 27° C. (trace 302) and reference current Isense based on the trimmed value of Ipref according to various scale settings applied by current scaler 216 represented by traces 310, 312, 314, 316, 318 and 320. As shown, trace 310 represents a setting in which Isense has a temperature coefficient of 6.0 nA/° C. and a dc offset of 1.0 µA at 27° C.; trace 312 represents a setting in which Isense has a temperature coefficient of 9.0 nA/° C. and a dc offset of 1.5 µA at 27° C.; trace 314 represents a setting in which Isense has a temperature coefficient of 12.0 nA/° C. and a dc offset of 2.0 µA at 27° C.; trace 316 represents a setting in which Isense has a temperature coefficient of 6.0 nA/° C. and a dc offset of 3.0 µA at 27° C.; trace 318 represents a setting in which Isense has a temperature coefficient of 9.0 nA/° C. and a dc offset of 3.5 µA at 27° C.; and trace 320 represents a setting in which Isense a has temperature coefficient of 12.0 nA/° C. and a dc offset of 4.0 µA at 27° C. In some embodiments, once the dc value and temperature coefficient of Ipref (trace 302) is trimmed and/or calibrated, settings can be applied to current scaler 216 to produce reference current Isense having an accurate predetermined dc offset value and temperature coefficient.

It should be understood that the graphs depicted in FIGS. 3A-C represent just a small number of many possible reference current settings and configurations. The actual currents, temperature coefficients and trim settings maybe different in alternative embodiments.

Figure 4A:
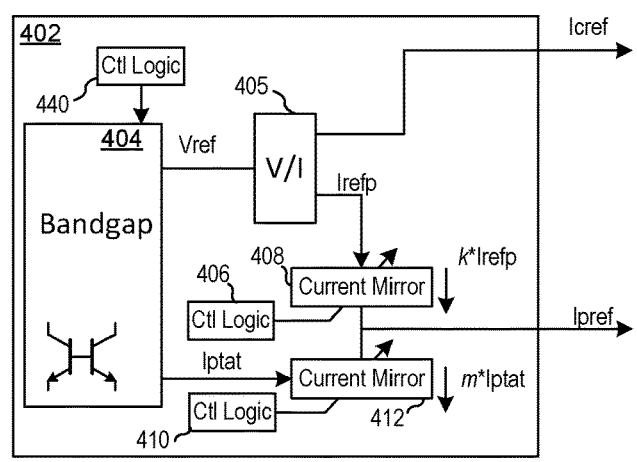
FIGS. 4A, 4B, 4C and 4D illustrate schematics of a reference current generator according to an embodiment.

FIG. 4A illustrates an embodiment current reference circuit 402 that may be used to implement current reference circuit 202 illustrated in FIG. 2A. As shown, current reference circuit 402 includes a bandgap circuit 404 that produces a reference voltage Vref and a PTAT current Iptat. Reference voltage Vref is converted into constant currents Irefp and Icref using voltage to current converter 405. PTAT current Iptat is scaled by a factor of m using adjustable current mirror 412, and constant current Irefp is scaled by a factor of k using adjustable current mirror 408. In various embodiments, adjustable current mirror 408 in conjunction with voltage-to-current converter 405 and bandgap circuit 404 may serve as a programmable constant current generator. Control logic 406 controls the scale factor k of adjustable current mirror 408, control logic 410 controls the scale factor m of adjustable current mirror 412, and control logic 440 controls at least one trim setting of bandgap circuit 404. Adjustable current mirror 412, in conjunction with bandgap circuit 404, may serve as a programmable PTAT current generator.

Figure 4B:
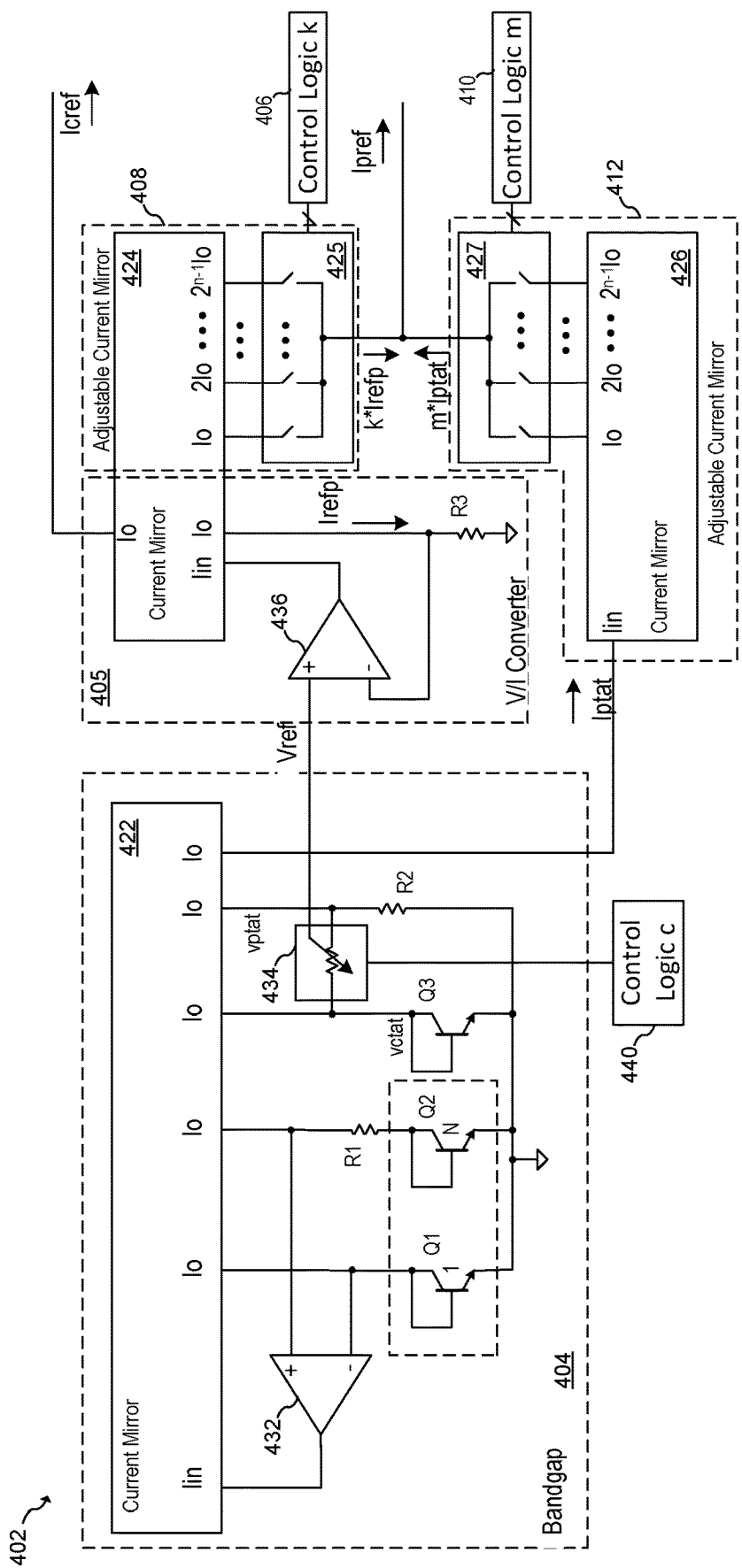

FIG. 4B illustrates a schematic of one possible implementation of current reference circuit 402 illustrated in FIG. 4A, which includes bandgap circuit 404, voltage-to-current converter 405, adjustable current mirrors 408 and 412, and control logic circuits 406, 410 and 440.

As shown, bandgap circuit 404 includes npn bipolar transistors Q1, Q2 and Q3, resistors R1 and R2, digital potentiometer 434, amplifier 432, and current mirror 402. Current mirror 422 includes an input Iin configured to receive a current and a plurality of outputs Jo configured to output a current proportional to the received current at input Iin. Npn bipolar transistors Q1 and Q2, amplifier 432, and current mirror 422 form a PTAT current generator that produces a PTAT current Iptat. During operation, a feedback loop formed by amplifier 432 and current mirror 422 forces the base emitter voltage of diode connected transistor Q1 to be the same as the voltage across the series combination of diode connected transistor Q2 and resistor R1. When the ratio of the emitter area of transistor Q2 to the emitter area of transistor Q1 is N, and both transistors Q1 and Q2 see the same current, it can be shown that the current through transistors Q1 and Q2 (as well as the currents that flow through all branches of current mirror 422) are $V_T/R_1 \ln(N)$, where $V_T$ is the diode thermal voltage, and $R_1$ is the resistance of resistor R. Since the diode thermal voltage is proportional to absolute temperature, current Iptat produced by bandgap circuit 404 is also proportional to absolute temperature.

In some embodiments, bandgap circuit 404 is also configured to produce a programmable reference voltage using a reference voltage generation circuit that includes npn bipolar transistor Q3, resistor R2 and digital potentiometer 434. During operation, the voltage vctat across the base-emitter junction of diode connected transistor Q3 is complementary to absolute temperature (e.g. inversely proportional to temperature), while the voltage across resistor R2 (that receives a PTAT current from current mirror 422) is proportional to temperature. Digital potentiometer 434 forms a voltage divider between the complementary to absolute temperature voltage vctat and the proportional to temperature voltage vptat. In some embodiments, the digital setting of digital potentiometer 434 is set such that the reference voltage node Vref coupled to the wiper voltage of digital potentiometer 434 is set such that voltage-to-current converter 405 produces a current Irefp that is substantially independent of temperature. In various embodiments, current Irefp changes less than +/−0.5% over the usable temperature range. In some embodiments, this usable temperature range is from −55° C. to 125° C.

In some embodiments, digital potentiometer 434 is implemented using a resistor network having a plurality of resistors coupled in series, and a plurality of switches configured to connect the wiper terminal to a selected node within the resistor network. The plurality of switches may each be implemented using, for example, a MOS transistor.

Voltage-to-current converter 405 includes amplifier 436, a portion of current mirror 424 and resistor R3. During operation, a feedback loop formed by amplifier 436 and current mirror 424 force the voltage across resistor R3 to be about the same as reference voltage Vref at the positive terminal of amplifier 436. Accordingly, the current Irefp, across resistor R3 is Vref/R3, which is referred to herein as a constant current. In some embodiments, control logic 440 is used to select a setting for digital potentiometer 434 that causes constant current Irefp to be substantially constant over temperature such that the temperature variation of Irefp is less than +/−0.5% over its operational range.

Adjustable current mirror 408 scales constant current Irefp according to a scale k using a switching network 425 to select one among n−1 binary weighted outputs of current mirror 424. In some embodiments, adjustable current mirror 408 provides a scaled current having between 4 and 6 bits of resolution; however, bit resolutions outside of this range could also be used depending on the particular embodiment and its specifications. As shown, current mirror 424 includes current output Jo that produces a first current proportional to Irefp. In some embodiments, output current Jo may be equal to constant current Irefp, or may be some other multiple of constant current Irefp. Current 2Io is twice current Irefp, and current $2^{n-1}$Io is $2^{n-1}$ times current Io. Current mirror 224 may also include outputs (not shown) that provide other powers of two times Io (e.g. $2^2$, $2^3$) up to $2^{n-1}$ to form the selectable binary weighted current outputs.

Adjustable current mirror 412 scales PTAT current Iptat according to a scale factor m using a switching network 427 to select one among n−1 binary weighted outputs of current mirror 426. In some embodiments, adjustable current mirror 412 provides a scaled current with between 6 and 8 bits of resolution; however, bit resolutions outside of this range could also be used depending on the particular embodiment and its specifications. The operation of current mirror 426 and switching network 427 may be similar to the operation of current mirror 424 and switching network 425 described above.

In some embodiments, all or a portion of adjustable current mirrors 408 and 412 may provide thermometer coded outputs. Switching networks 425 and 427 may be implemented, for example, using MOS switches. In alternative embodiments, switching networks 425 and 427 may be omitted, and current mirrors 424 and 426 are configured to selectively activate and deactivate individual current mirror output stages in accordance with control words provided by control logic 406 and 410.

In various embodiments, current mirrors 422 and 424 maybe implemented using current mirrors comprising PMOS transistors, and current mirror 426 maybe implemented using a current mirror comprising NMOS transistors as described below with respect to FIGS. 4C and 4D. Alternatively, other types of current mirrors could be used.

Figure 4C:
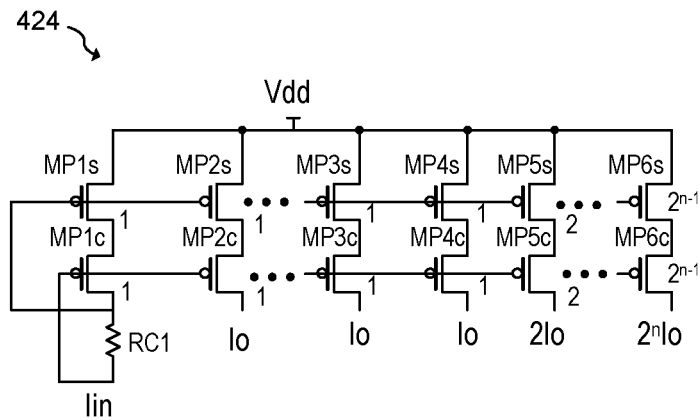

FIG. 4C illustrates a current mirror circuit 424 that could be used to implement current mirror 424 shown in FIG. 4B. As shown current mirror 424 includes current mirror transistors MP1s, MP2s, MP3s, MP4s, MP5s and MP6s and cascode transistors MP1c, MP2c, MP3c, MP4c, MP5c and MP6c. Resistor RC1 is used to provide a bias voltage to the gates of cascode transistors MP1c, MP2c, MP3c, MP4c, MP5c and MP6c.

Current mirror transistors MP3s, MP4s, MP5s and MP6s and cascode transistors MP3c, MP4c, MP5c and MP6c that form the binary weighted current output of current mirror 424 have corresponding binary weighted device sizes. In some embodiments, some or all of the transistors in current mirror 424 may be implemented using unit-sized PMOS devices for better matching. For example, transistor MP4s may be implemented using one unit sized PMOS transistor, transistor MP5s may be implemented using two unit sized PMOS transistors, and transistor MP6s may be implemented using $2^{n-1}$ unit sized PMOS transistors. Current mirror circuits similar to current mirror 424 may be used to implement current mirror 422 shown in FIG. 4B and current mirror 210 shown in FIG. 2A with the requisite adjustments and modifications.

Figure 4D:
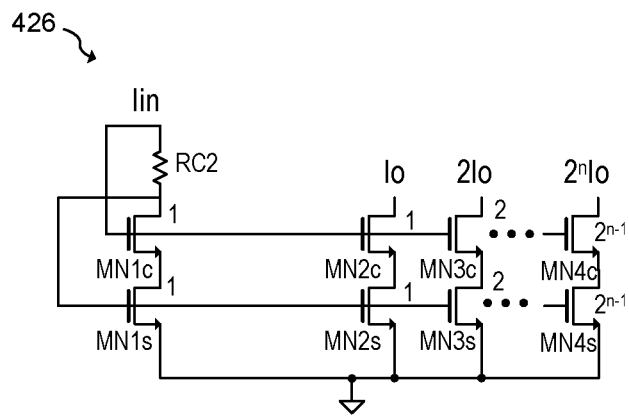

FIG. 4D illustrates a current mirror circuit that could be used to implement current mirror 426 shown in FIG. 4B. As shown, current mirror circuit 426 includes current mirror transistors MN1s, MN2s, MN3s and MN4s and cascode transistors MN1c, MN2c, MN3c and MN4c. Resistor RC2 is used to provide a bias voltage to the gates of cascode transistors MN1c, MN2c, MN3c and MN4c. Current mirror transistors MN2s, MN3s and MP4s and cascode transistors MP2c, MP3c and M45c that form the binary weighted current output of current mirror 426 have corresponding binary weighted device sizes. In some embodiments, some or all of the transistors in current mirror 426 are implemented using unit sized NMOS devices for better matching. Current mirror circuits similar to current mirror 426 may be used to implement current mirror 214 shown in FIG. 2A with the requisite adjustments and modifications.

It should be understood that the embodiment of FIGS. 4A-4D is just one example of many possible ways to physically implement embodiment current generators. In alternative embodiments, other known circuits and methods may be used to generate currents that are proportional to temperature, to generate currents that are substantially independent of temperature and to scale currents.

Figure 5:
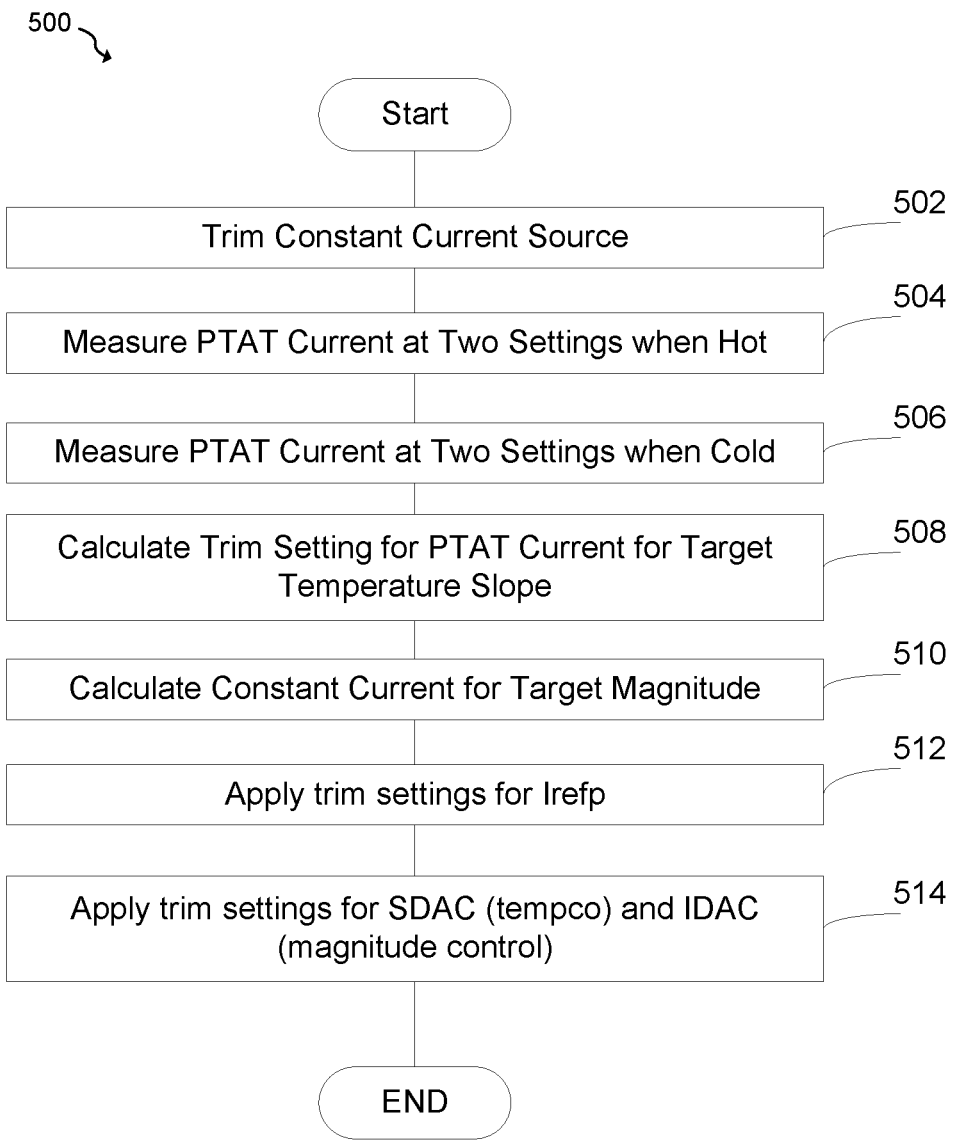
FIG. 5 illustrates a flowchart of a method according to an embodiment.

FIG. 5 illustrates a flow chart of a method 500 of trimming an embodiment current generator according to an embodiment of the present invention. In various embodiments, method 500 is used to trim and calibrate embodiment reference current generator 106 shown in FIG. 1A, reference current generator 200 shown in FIGS. 2A and 2B and/or the circuits shown in FIG. 4A-4D. The method may be implemented, for example, using a tester, such as tester 230 shown in FIG. 2B, and a device that changes the temperature of the current generator, such as thermal chuck 240 shown in FIG. 2B.

In step 502, constant current Irefp is trimmed. In one embodiment, constant current Irefp is trimmed by measuring constant current Irefp over a plurality of temperatures and selecting a trim setting that causes constant current Irefp to produce a current that is substantially independent of temperature and/or selecting a trim setting that reduces or minimizes the dependency of constant current Irefp with respect to temperature. The calibration of step 502 may be performed, for example, by using thermal chuck 240 to change the temperature of reference current generator 200, performing a series of measurements of current Irefp via test/trim interface 222, determining the trim value based on the series of measurements, and applying the trim value to a trim register and/or a set of fuses. In the embodiment of FIG. 4B, the trim value may be applied to digital potentiometer 434 via control logic 440. Alternatively, other known methods may be used to trim and/or calibrate a current that is substantially independent of temperature. In some embodiments, the measurements of step 502 that are performed over different temperatures may be performed concurrently with steps 504 and 506 described below.

In step 504, PTAT current Iptat is measured at a hot temperature $T_H$ at two trim settings. In an embodiment, the current generator is heated to a first temperature using, for example, thermal chuck 240. A first scale setting m is applied to current Iptat using, for example, control logic 410 and adjustable current mirror 412. Next, m*Iptat is measured using tester 230 to form measurement $I_{PTAT\_H\_MIN}$. A second scale setting m is then applied to current Iptat, and m*Iptat is measured again to form measurement $I_{PTAT\_H\_MAX}$. In some embodiments, the first applied temperature is a maximum operating temperature and the two applied scale settings m are a maximum scale setting and a minimum scale setting that respectively provide a maximum current and a minimum current from adjustable current mirror 412. However, it should be understood that other temperatures and/or non-minimum and non-maximum scale settings could be used depending on the particular embodiment and its specifications.

In step 506, PTAT current Iptat is measured at a cold temperature Tc at the two trim settings. In an embodiment, the current generator is cooled to a second temperature using, for example, thermal chuck 240. The first scale setting m is applied to current Iptat and m*Iptat is measured using tester 230 to form measurement $I_{PTAT\_C\_MIN}$. Next, the second scale setting m is applied to current Iptat and m*Iptat is measured again to form measurement $I_{PTAT\_L\_MAX}$. It should be appreciated that measurement steps 504 and 506 do not need to be performed in any particular order with respect to each other prior to calculation steps 508 and 510.

In step 508, the trim setting m is calculated based on the measurements made in steps 502 and 504 such that proportional to temperature current m*Ipref achieves a predetermined temperature coefficient. In an embodiment, trim setting m is calculated according to:

$$m=([(T_H-T_L)*S_D-I_{PTAT\_H\_MIN}+I_{PTAT\_C\_MIN}]\\ *N_{STEPS})/[(I_{PTAT\_H\_MAX}-I_{PTAT\_H\_MIN})-\\ (I_{PTAT\_C\_MAX}-I_{PTAT\_C\_MIN})],$$

where $S_D$ is the predetermined or target temperature coefficient and $N_{STEPS}$ is the number of the programmable scale settings achievable by adjustable current mirror 412.

In step 510, the trim setting k applied to constant current Irefp that offsets m*Iptat to achieve a predetermined temperature slope is calculated based on the measurements made in steps 502 and 504. In an embodiment, trim setting k is calculated according to:

$$I_{OFFSET}=I_{PTAT\_C\_MIN}+m[I_{PTAT\_C\_MAX}-I_{PTAT\_C\_MIN})/\\ N_{STEPS}]+S_D(T_{REF}-T_L)-I_{TARG}$$

where $I_{OFFSET}$ is the final trimmed current k*Irefp (also referred to as a constant current offset) to be subtracted from m*Iptat to produced current Ipref, and $I_{TARG}$ is the target value for Ipref at reference temperature Tref. The value for k can be found as follows:

$$k=I_{OFFSET}/\text{Irefp},$$

where Irefp is the trimmed constant current.

In step 512, the trim settings are programmed for scale settings m and k in order that the difference of m*Iptat and k*Irefp form a resulting current Ipref that has the predetermined temperature coefficient $S_D$ and the predetermined offset value $I_{TARG}$.

In step 514, trim values are set for current scaler 216 shown in FIG. 2A. In an embodiment, a value for magnitude value IDAC is applied to current mirror 210 and a value for tempco value SDAC are applied to current mirror 214 in order that the sum of currents Icm and Ipm that are respectively output by current mirrors 210 and 214 form a predetermined reference current for use by sense amplifier 104 in FIG. 1A. These values may be predetermined based on previously measured characteristics of memory cell 102.

Figure 6:
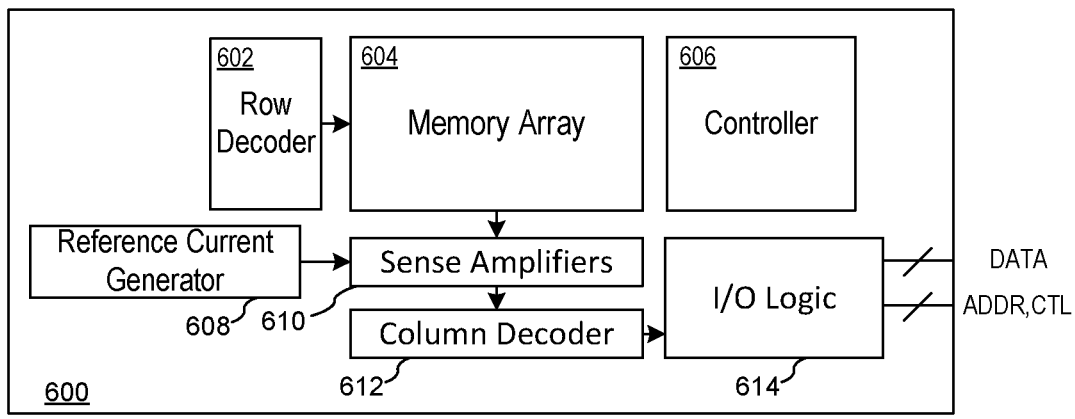
FIG. 6 illustrates an integrated circuit that includes a memory system and a reference current generator according to an embodiment.

FIG. 6 illustrates an integrated circuit 600 that includes a memory that utilizes a reference current generator according to the present invention. As shown, integrated circuit 600 includes memory array 604, row decoder 602, controller 606, sense amplifiers 610, column decoder 612, I/O logic 614 and embodiment reference current generator 608. Memory array 604 includes an array of memory cells that may include non-volatile memory cells such as floating gate memory cells or SONOS memory cells. Sense amplifiers 610 are coupled to columns of the memory array and are configured to compare currents from a selected memory cell to a reference current produced by embodiment reference current generator 608. Reference current generator 608 may be implemented using any of the reference current generation circuits described with respect to embodiments herein. During operation, based on address data ADDR provided at the input to I/O logic 614, row decoder selects a row of memory cells within memory array 604 to be read by sense amplifiers 610, and column decoder 612 selects columns of memory array to be output via I/O logic 614 via data lines DATA. Controller 606 is a memory controller that controls the operation of the memory.

Embodiments of the present invention may be implemented in a variety of semiconductor processes, such as a standard CMOS process and/or a CMOS process that has been modified to accommodate one or more particular types of non-volatile memory.

Figure 7:
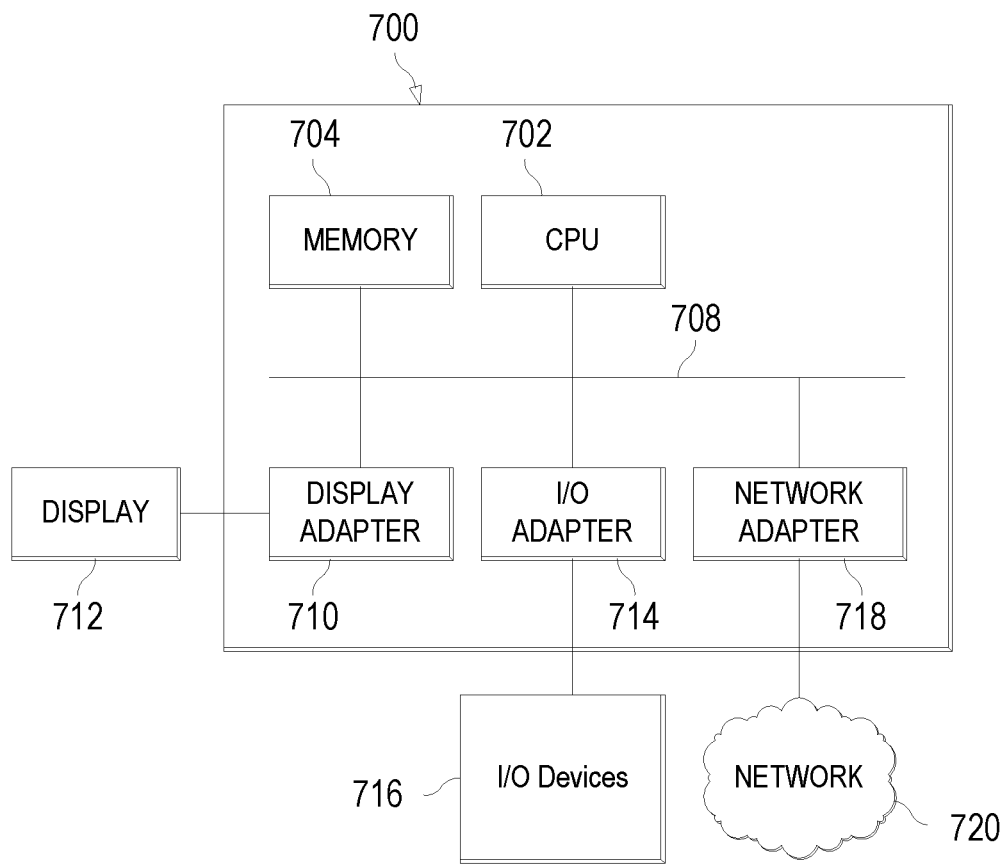
FIG. 7 illustrates a processing system that can be used to implement portions of embodiment systems.

Referring now to FIG. 7, a block diagram of a processing system 700 is provided in accordance with an embodiment of the present invention. The processing system 700 depicts a general-purpose platform and the general components and functionality that may be used to implement portions of embodiments described herein such as controller 234 of tester 230 described above with respect to FIG. 2B. For example, processing system 700 may be used to implement some or all of the processing performed by tester 230 to measure and trim embodiment current reference circuits. Processing system 700 may also be used to implement portions of the embodiment method described herein with respect to FIG. 6.

Processing system 700 may include, for example, a central processing unit (CPU) 702, and memory 704 connected to a bus 708, and may be configured to perform the processes discussed above according to programmed instructions stored in memory 704 or on other non-transitory computer readable media. The processing system 700 may further include, if desired or needed, a display adapter 710 to provide connectivity to a local display 712 and an input-output (I/O) adapter 714 to provide an input/output interface for one or more input/output devices 716, such as a mouse, a keyboard, flash drive or the like.

The processing system 700 may also include a network interface 718, which may be implemented using a network adaptor configured to be coupled to a wired link, such as a network cable, USB interface, or the like, and/or a wireless/cellular link for communications with a network 720. The network interface 718 may also comprise a suitable receiver and transmitter for wireless communications. It should be noted that the processing system 700 may include other components. For example, the processing system 700 may include hardware components power supplies, cables, a motherboard, removable storage media, cases, and the like if implemented externally. These other components, although not shown, are considered part of the processing system 700. In some embodiments, processing system 700 may be implemented on a single monolithic semiconductor integrated circuit and/or on the same monolithic semiconductor integrated circuit as other disclosed system components.

Embodiments of the present invention are summarized here. Other embodiments can also be understood from the entirety of the specification and the claims filed herein.

Example 1. A circuit including: a trimmable reference current generator having a temperature dependent current output node, the trimmable reference current generator including: a proportional to absolute temperature (PTAT) current generation circuit; a first programmable current scaling circuit coupled to the PTAT current generation circuit and including a first output coupled to the temperature dependent current output node; a constant current generation circuit; a second programmable current scaling circuit coupled to the constant current generation circuit and including a first output coupled to the temperature dependent current output node; and a reference interface circuit having an input coupled to the temperature dependent current output node and an output configured to be coupled to a reference current input of a memory sense amplifier.

Example 2. The circuit of example 1, where the reference interface circuit includes: a third programmable current scaling circuit having an input coupled to the temperature dependent current output node; a fourth programmable current scaling circuit having an input coupled to the constant current generation circuit, where the output of the reference interface circuit is configured to provide a sum of an output of the third programmable current scaling circuit and an output of the fourth programmable current scaling circuit; and a summation circuit coupled to an output of the third programmable current scaling circuit, an output of the fourth programmable current scaling circuit, and the output of the reference interface circuit.

Example 3. The circuit of one example 2, where: the third programmable current scaling circuit includes a third current mirror having a plurality of selectable outputs; the fourth programmable current scaling circuit includes a fourth current mirror having a plurality of selectable outputs; and the summation circuit includes a node connecting together the output of the third programmable current scaling circuit, the output of the fourth programmable current scaling circuit, and the output of the reference interface circuit.

Example 4. The circuit of one of examples 1 to 3, further including, a reference voltage generation circuit coupled to the PTAT current generation circuit, where the constant current generation circuit includes a voltage-to-current converter having an input coupled to an output of the reference voltage generation circuit.

Example 5. The circuit of example 5, where: the PTAT current generation circuit includes a first bipolar transistor having a first emitter area, a second bipolar transistor having a second emitter area different from the first emitter area coupled in series with a resistor, and a current mirror coupled to the first bipolar transistor and the second bipolar transistor; and the reference voltage generation circuit includes a third bipolar transistor coupled to the current mirror, a resistor network coupled to the current mirror and the third bipolar transistor, where the voltage-to-current converter is coupled to an output of the resistor network.

Example 6. The circuit of one example 5, where the resistor network is configured to produce a reference voltage that, when applied to the voltage-to-current converter, causes the voltage-to-current converter to produce a current that is substantially independent of temperature.

Example 7. The circuit of one of examples 5 or 6, where the resistor network is trimmable.

Example 8. The circuit of one of examples 1 to 7, where: the first programmable current scaling circuit includes a first current mirror circuit having a plurality of selectable outputs; and the second programmable current scaling circuit includes a second current mirror circuit having a plurality of selectable outputs.

Example 9. The circuit of one of examples 1 to 8, where the first programmable current scaling circuit and the second programmable current scaling circuit are programmed to values that produce a first temperature dependent reference current having a first predetermined dc value at a first temperature and a first predetermined temperature coefficient.

Example 10. The circuit of example 9, where the reference interface circuit is configured to scale the first temperature dependent reference current to form a first scaled current; and add a constant current to the first scaled current to produce a second temperature dependent reference current having a second predetermined dc value at the first temperature and a second predetermined temperature coefficient.

Example 11. A method including: measuring an output current of a programmable PTAT generator of a reference current generator at a first scale setting of a plurality of programmable scale settings at a first temperature to obtain a first current measurement; measuring the output current of the programmable PTAT generator at a second scale setting of the plurality of programmable scale settings at the first temperature to obtain a second current measurement; measuring the output current of the programmable PTAT generator at the first scale setting of the plurality of programmable scale settings at a second temperature to obtain a third current measurement; and measuring the output current of the programmable PTAT generator at the second scale setting of the plurality of programmable scale settings at the second temperature to obtain a fourth current measurement; determining a scale setting of the plurality of programmable scale settings that configures the programmable PTAT generator to generate an output current having a predetermined temperature coefficient based on the first current measurement, the second current measurement, the third current measurement and the fourth current measurement; setting the programmable PTAT generator to the determined scale setting to provide a trimmed temperature dependent current; determining a constant current offset that provides a predetermined dc offset current at a third temperature when subtracted from the trimmed temperature dependent current; setting a programmable constant current generator of the reference current generator to provide the determined constant current offset; generating, by the reference current generator, a reference current based on the trimmed temperature dependent current and the determined constant current offset; and comparing an output current of a memory cell of a memory circuit with the reference current.

Example 12. The method of example 11, where: the first temperature corresponds to a minimum operating temperature of the memory circuit; the second temperature corresponds to a maximum operating temperature of the memory circuit; the first scale setting corresponds to a minimum current setting of the programmable PTAT generator; and the second scale setting corresponds to a maximum current setting of the programmable PTAT generator.

Example 13. The method of one of examples 11 or 12, where generating, by the reference current generator, the reference current includes: subtracting the determined constant current offset from the trimmed temperature dependent current to provide a first temperature dependent reference current; scaling the first temperature dependent reference current to form a second temperature dependent current; scaling a constant current to provide a scaled constant current; and summing the second temperature dependent current and the scaled constant current to form the reference current.

Example 14. The method of example 13, where: scaling the first temperature dependent reference current to form the second temperature dependent current includes selecting one or more selectable output branches from a current mirror having an input configured to receive the first temperature dependent reference current; and scaling the constant current to provide the scaled constant current includes selecting one or more selectable output branches from a current mirror having an input configured to receive the constant current.

Example 15. The method of one of examples 11 to 14, further including trimming the programmable constant current generator to provide a temperature dependent current.

Example 16. The method of one of examples 11 to 15, where: the programmable constant current generator includes a reference voltage generation circuit coupled to a voltage-to-current converter; and trimming the programmable constant current generator includes trimming a reference voltage of the reference voltage generation circuit.

Example 17. The method of one of examples 11 to 16, where: setting the programmable PTAT generator to the determined scale setting includes selecting at least one selectable output of a first current mirror; and setting the programmable constant current generator of the reference current generator includes selecting at least one selectable output of a second current mirror.

Example 18. The method of one of examples 11 to 17, where determining the scale setting includes determining the scale setting of the plurality of programmable scale settings that configured the programmable PTAT generator to generate an output current having the predetermined temperature coefficient comprises calculating:

$$m = ([(T_H - T_L)*S_D - I_{PTAT\_H\_MIN} + I_{PTAT\_C\_MIN}] *N_{STEPS})/[(I_{PTAT\_H\_MAX} - I_{PTAT\_H\_MIN}) - (I_{PTAT\_C\_MAX} - I_{PTAT\_C\_MIN})],$$

where m is the determined scale setting of the plurality of programmable scale settings, $T_H$ is the first temperature, $T_L$ is the second temperature, $S_D$ is the predetermined temperature coefficient, $N_{STEPS}$ is a number of the programmable scale settings, $I_{PTAT\_H\_MAX}$ is the first current measurement, $I_{PTAT\_H\_MIN}$ is the second current measurement, $I_{PTAT\_C\_MAX}$ is the third current measurement, and $I_{PTAT\_C\_MIN}$ is the fourth current measurement.

Example 19. The method of example 18, where determining the constant current offset comprises calculating:

$$I_{OFFSET} = I_{PTAT\_C\_MIN} + m[I_{PTAT\_C\_MAX} - I_{PTAT\_C\_MIN})/N_{STEPS1}] + SD(T_{REF} - T_L) - I_{TARG},$$

where $I_{OFFSET}$ is the determined constant current offset, and $I_{TARG}$ is the predetermined dc offset current, and $T_{REF}$ is the third temperature.

Example 20. A system including: a memory array including a plurality of memory cells; a plurality of sense amplifiers coupled to the plurality of memory cells, each of the plurality of sense amplifiers configured to compare a current flowing through respective memory cell of the plurality of memory cells with a reference current; a trimmable reference current generator configured to produce first current including a difference between a predetermined current proportional to temperature and a first predetermined constant current; and a reference interface circuit configured to receive the first current, scale the received first current to form a scaled second current, and sum the scaled second current with a second predetermined constant current to form the reference current.

Example 21. The system of example 20, where the plurality of memory cells includes a plurality of SONOS memory cells.

Example 22. The system of one of examples 20 or 21, further including a tester configured to: measure a first PTAT current produced by the trimmable current reference generator at a first temperature when at a first scale setting; measure a second PTAT current produced by the trimmable current reference generator at the first temperature when at a second scale setting; measure a third PTAT current produced by the trimmable current reference generator at a second temperature when at the first scale setting; measure a fourth PTAT current produced by the trimmable current reference generator at the second temperature when at the second scale setting, where the first temperature is greater than the second temperature, and the first scale setting causes the trimmable reference current generator to produce a greater current than the second scale setting; determining a trim setting of the trimmable reference current generator based on the measured first PTAT current, the measured second PTAT current, the measured third PTAT current, the measured fourth PTAT current and a target temperature coefficient; and apply the determined trim setting to the trimmable reference current generator.

Example 23. The system of one of examples 20 to 22, where the reference interface circuit includes: a first adjustable current mirror configured to receive the first current and provide the scaled second current via a plurality of first selectable current mirror outputs; and a second adjustable current mirror configured to receive a constant reference current and provide the predetermined constant current via a plurality of second selectable current mirror outputs; and a common node coupled to one or more selected outputs of the plurality of first selectable current mirror outputs, one or more selected outputs of the plurality of second selectable current mirror outputs and an output of the reference interface circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a trimmable reference current generator having a temperature dependent current output node, the trimmable reference current generator comprising:
   a proportional to absolute temperature (PTAT) current generation circuit;
   a first programmable current scaling circuit coupled to the PTAT current generation circuit and comprising a first output coupled to the temperature dependent current output node;
   a constant current generation circuit;
   a second programmable current scaling circuit coupled to the constant current generation circuit and comprising a first output coupled to the temperature dependent current output node; and
   a reference interface circuit having an input coupled to the temperature dependent current output node and an output configured to be coupled to a reference current input of a memory sense amplifier.

2. The circuit of claim 1, wherein the reference interface circuit comprises:
   a third programmable current scaling circuit having an input coupled to the temperature dependent current output node;
   a fourth programmable current scaling circuit having an input coupled to the constant current generation circuit, wherein the output of the reference interface circuit is configured to provide a sum of an output of the third programmable current scaling circuit and an output of the fourth programmable current scaling circuit; and
   a summation circuit coupled to an output of the third programmable current scaling circuit, an output of the fourth programmable current scaling circuit, and the output of the reference interface circuit.

3. The circuit of claim 2, wherein:
the third programmable current scaling circuit comprises a third current mirror having a plurality of selectable outputs;
the fourth programmable current scaling circuit comprises a fourth current mirror having a plurality of selectable outputs; and
the summation circuit comprises a node connecting together the output of the third programmable current scaling circuit, the output of the fourth programmable current scaling circuit, and the output of the reference interface circuit.

4. The circuit of claim 1, further comprising, a reference voltage generation circuit coupled to the PTAT current generation circuit, wherein the constant current generation circuit comprises a voltage-to-current converter having an input coupled to an output of the reference voltage generation circuit.

5. The circuit of claim 4, wherein:
the PTAT current generation circuit comprises
   a first bipolar transistor having a first emitter area,
   a second bipolar transistor having a second emitter area different from the first emitter area coupled in series with a resistor, and
   a current mirror coupled to the first bipolar transistor and the second bipolar transistor; and
the reference voltage generation circuit comprises
   a third bipolar transistor coupled to the current mirror,
   a resistor network coupled to the current mirror and the third bipolar transistor, wherein the voltage-to-current converter is coupled to an output of the resistor network.

6. The circuit of claim 5, wherein the resistor network is configured to produce a reference voltage that, when applied to the voltage-to-current converter, causes the voltage-to-current converter to produce a current that is substantially independent of temperature.

7. The circuit of claim 6, wherein the resistor network is trimmable.

8. The circuit of claim 1, wherein:
the first programmable current scaling circuit comprises a first current mirror circuit having a plurality of selectable outputs; and
the second programmable current scaling circuit comprises a second current mirror circuit having a plurality of selectable outputs.

9. The circuit of claim 1, wherein the first programmable current scaling circuit and the second programmable current scaling circuit are programmed to values that produce a first temperature dependent reference current having a first predetermined dc value at a first temperature and a first predetermined temperature coefficient.

10. The circuit of claim 9, wherein the reference interface circuit is configured to
scale the first temperature dependent reference current to form a first scaled current; and
add a constant current to the first scaled current to produce a second temperature dependent reference current having a second predetermined dc value at the first temperature and a second predetermined temperature coefficient.

11. A method comprising:
measuring an output current of a programmable PTAT generator of a reference current generator at a first scale setting of a plurality of programmable scale settings at a first temperature to obtain a first current measurement;
measuring the output current of the programmable PTAT generator at a second scale setting of the plurality of programmable scale settings at the first temperature to obtain a second current measurement;
measuring the output current of the programmable PTAT generator at the first scale setting of the plurality of programmable scale settings at a second temperature to obtain a third current measurement; and
measuring the output current of the programmable PTAT generator at the second scale setting of the plurality of programmable scale settings at the second temperature to obtain a fourth current measurement;
determining a scale setting of the plurality of programmable scale settings that configures the programmable PTAT generator to generate an output current having a predetermined temperature coefficient based on the first current measurement, the second current measurement, the third current measurement and the fourth current measurement;
setting the programmable PTAT generator to the determined scale setting to provide a trimmed temperature dependent current;
determining a constant current offset that provides a predetermined dc offset current at a third temperature when subtracted from the trimmed temperature dependent current;
setting a programmable constant current generator of the reference current generator to provide the determined constant current offset;
generating, by the reference current generator, a reference current based on the trimmed temperature dependent current and the determined constant current offset; and
comparing an output current of a memory cell of a memory circuit with the reference current.

12. The method of claim 11, wherein:
the first temperature corresponds to a minimum operating temperature of the memory circuit;
the second temperature corresponds to a maximum operating temperature of the memory circuit;
the first scale setting corresponds to a minimum current setting of the programmable PTAT generator; and
the second scale setting corresponds to a maximum current setting of the programmable PTAT generator.

13. The method of claim 11, wherein generating, by the reference current generator, the reference current comprises:
subtracting the determined constant current offset from the trimmed temperature dependent current to provide a first temperature dependent reference current;
scaling the first temperature dependent reference current to form a second temperature dependent current;
scaling a constant current to provide a scaled constant current; and
summing the second temperature dependent current and the scaled constant current to form the reference current.

14. The method of claim 13, wherein:
scaling the first temperature dependent reference current to form the second temperature dependent current comprises selecting one or more selectable output branches from a current mirror having an input configured to receive the first temperature dependent reference current; and
scaling the constant current to provide the scaled constant current comprises selecting one or more selectable output branches from a current mirror having an input configured to receive the constant current.

15. The method of claim 11, further comprising trimming the programmable constant current generator to provide a temperature dependent current.

16. The method of claim 15, wherein:
the programmable constant current generator comprises a reference voltage generation circuit coupled to a voltage-to-current converter; and
trimming the programmable constant current generator comprises trimming a reference voltage of the reference voltage generation circuit.

17. The method of claim 15, wherein:
setting the programmable PTAT generator to the determined scale setting comprises selecting at least one selectable output of a first current mirror; and
setting the programmable constant current generator of the reference current generator comprises selecting at least one selectable output of a second current mirror.

18. The method of claim 11, wherein determining the scale setting comprises:
determining the scale setting of the plurality of programmable scale settings that configured the programmable PTAT generator to generate an output current having the predetermined temperature coefficient comprises calculating:

$$m=([(T_H-T_L)*S_D-I_{PTAT\_H\_MIN}+I_{PTAT\_C\_MIN}]*N_{STEPS})/[(I_{PTAT\_H\_MAX}-I_{PTAT\_H\_MIN})-(I_{PTAT\_C\_MAX}-I_{PTAT\_C\_MIN})],$$

where m is the determined scale setting of the plurality of programmable scale settings, $T_H$ is the first temperature, $T_L$ is the second temperature, $S_D$ is the predetermined temperature coefficient, $N_{STEPS}$ is a number of the programmable scale settings, $I_{PTAT\_H\_MAX}$ is the first current measurement, $I_{PTAT\_H\_MIN}$ is the second current measurement, $I_{PTAT\_C\_MAX}$ is the third current measurement, and $I_{PTAT\_C\_MIN}$ is the fourth current measurement.

19. The method of claim 18, wherein determining the constant current offset comprises calculating:

$$I_{OFFSET}=I_{PTAT\_C\_MIN}+m*[(I_{PTAT\_C\_MAX}-I_{PTAT\_C\_MIN})/N_{STEPS1}]+S_D(T_{REF}-T_L)-I_{TARG},$$

where $I_{OFFSET}$ is the determined constant current offset, and $I_{TARG}$ is the predetermined dc offset current, and $T_{REF}$ is the third temperature.

20. A system comprising:
a memory array comprising a plurality of memory cells;
a plurality of sense amplifiers coupled to the plurality of memory cells, each of the plurality of sense amplifiers configured to compare a current flowing through a respective memory cell of the plurality of memory cells with a reference current;
a trimmable reference current generator configured to produce a first current comprising a difference between a predetermined current proportional to temperature and a first predetermined constant current; and
a reference interface circuit configured to receive the first current, scale the received first current to form a scaled second current, and sum the scaled second current with a second predetermined constant current to form the reference current.

21. The system of claim 20, wherein the plurality of memory cells comprises a plurality of SONOS memory cells.

22. The system of claim 20, further comprising a tester configured to:
measure a first PTAT current produced by the trimmable current reference generator at a first temperature when at a first scale setting;
measure a second PTAT current produced by the trimmable current reference generator at the first temperature when at a second scale setting;
measure a third PTAT current produced by the trimmable current reference generator at a second temperature when at the first scale setting;
measure a fourth PTAT current produced by the trimmable current reference generator at the second temperature when at the second scale setting, wherein the first temperature is greater than the second temperature, and the first scale setting causes the trimmable reference current generator to produce a greater current than the second scale setting;
determining a trim setting of the trimmable reference current generator based on the measured first PTAT current, the measured second PTAT current, the measured third PTAT current, the measured fourth PTAT current and a target temperature coefficient; and
apply the determined trim setting to the trimmable reference current generator.

23. The system of claim 20, wherein the reference interface circuit comprises:
a first adjustable current mirror configured to receive the first current and provide the scaled second current via a plurality of first selectable current mirror outputs; and
a second adjustable current mirror configured to receive a constant reference current and provide the predetermined constant current via a plurality of second selectable current mirror outputs; and
a common node coupled to one or more selected outputs of the plurality of first selectable current mirror outputs, one or more selected outputs of the plurality of second selectable current mirror outputs and an output of the reference interface circuit.

* * * * *